United States Patent
Lagoon et al.

(10) Patent No.: US 7,613,973 B2
(45) Date of Patent: *Nov. 3, 2009

(54) METHOD FOR PROVIDING BITWISE CONSTRAINTS FOR TEST GENERATION

(75) Inventors: Vitaly Lagoon, Caulfield South (AU); Guy Baruch, Natania (IL)

(73) Assignee: Cadence Design (Israel) II Ltd., Rosh Ha'Ayin (IL)

( * ) Notice: Subject to any disclaimer, the term of this patent is extended or adjusted under 35 U.S.C. 154(b) by 165 days.

This patent is subject to a terminal disclaimer.

(21) Appl. No.: 11/015,020

(22) Filed: Dec. 20, 2004

(65) Prior Publication Data

US 2005/0203720 A1    Sep. 15, 2005

Related U.S. Application Data

(63) Continuation of application No. 09/939,743, filed on Aug. 28, 2001, now Pat. No. 6,918,076.

(60) Provisional application No. 60/228,087, filed on Aug. 28, 2000.

(51) Int. Cl.
 *G06F 11/263* (2006.01)
 *G06F 11/16* (2006.01)
(52) U.S. Cl. .................... 714/738; 714/735
(58) Field of Classification Search .......... 714/738, 714/735, 724, 734, 718, 25, 42, 54; 702/119
 See application file for complete search history.

(56) References Cited

U.S. PATENT DOCUMENTS 5,832,418 A * 11/1998 Meyer ................ 702/119
6,134,512 A    10/2000 Barrett
6,182,258 B1    1/2001 Hollander
6,918,076 B2 *  7/2005 Lagoon et al. ......... 714/738

(Continued)

FOREIGN PATENT DOCUMENTS

EP    1314045    5/2005

(Continued)

OTHER PUBLICATIONS

Chandra et al. "AVPGEN-A Test Generator for Architecture Verification", IEEE Transactions on Very Large Scale Integration (VLSI) Systems 3(2): 188-200, 1995. p. 194, 1-h Col., Line 40—r-h Col., Line 43.

(Continued)

*Primary Examiner*—Kevin L Ellis
*Assistant Examiner*—Dipakkumar Gandhi
(74) *Attorney, Agent, or Firm*—Rosenberg, Klein & Lee

(57) ABSTRACT

A method for enabling bitwise or bit slice constraints to be provided as part of the test generation process, by providing a language structure which enables these constraints to be expressed in a test generation language such as e code for example. The language structure for such bitwise constraints is then handled in a more flexible manner, such that the test generation process does not attempt to rigidly "solve" the expression containing the constraint as a function. Therefore, the propagation of constraints in such a structure do not necessarily need to be propagated from left to right, but instead are generated in a multi-directional manner. The language structure is particularly suitable for such operators as "[: ]", "|", "&", "^", "~", ">>" and "<<".

13 Claims, 1 Drawing Sheet

U.S. PATENT DOCUMENTS

2002/0019975 A1 2/2002 Johnson
2002/0049944 A1 4/2002 Lagoon et al.
2002/0055807 A1 5/2002 Zimmermann et al.

FOREIGN PATENT DOCUMENTS

JP 02154530 6/1990
WO WO2002/019108 3/2002

OTHER PUBLICATIONS

Chandra et al. "Architectural Verification of Processors Using Symbolic Instruction Graphs", IEEE, Cambridge, p. 454-459, 1994. Abstract.

* cited by examiner coverage feedback

METHOD FOR PROVIDING BITWISE CONSTRAINTS FOR TEST GENERATION

This Application is a continuation application of U.S. patent application Ser. No. 09/939,743, filed Aug. 28, 2001 now U.S. Pat. No. 6,918,076, which claims priority from U.S. Provisional Application No. 60/228,087, filed on Aug. 28, 2000, which is hereby incorporated by reference as if fully set forth herein.

FIELD OF THE INVENTION

The present invention relates to a method for providing bitwise constraints for test generation, and in particular, to such a method which is operative with a test generation code language such as that provided by the Specman™ functional programming environment (Verisity Design, Inc., Mountain View, Calif., USA).

BACKGROUND OF THE INVENTION

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

The process of verifying a design through a simulation model of the device is aided by the availability of hardware description languages such as Verilog and VHDL. These languages are designed to describe hardware at higher levels of abstraction than gates or transistors. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results which are output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment. For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce input stimuli.

One example of such a test generator is disclosed in U.S. Pat. No. 6,182,258, filed on Feb. 6, 1998, incorporated by reference as if fully set forth herein. This test generation procedure interacts with, and sits as a higher level over, such hardware description languages as Verilog and VHDL. The test generation procedure is written in a hardware-oriented verification specific object-oriented programming language. This language is used to write various tests, which are then used to automatically create a device verification test by a test generator module. A wide variety of design environments can be tested and verified with this language. Thus, the disclosed procedure is generalizable, yet is also simple to program and to debug by the engineer.

The disclosed language features a number of elements such as structs for more richly and efficiently describing the design of the device to be simulated by the model. Unfortunately, the disclosed language and resultant test generation environment does not include the ability to use bitwise constraints.

A bitwise constraint can also be termed a "bit slice constraint". In the modeling of hardware entities such as registers, and input data such as computer instruction streams, there is often a need to express a property over some partial segment of the variable. An example would be a computer instruction word that is 32 bits wide composed of an opcode field of 16 bits and an operand field of 16 bits, where the desired property is to keep the operand field to the value of zero.

U.S. patent application Ser. No. 09/020,792, described above, discloses a method of applying arithmetic constraints which consider the value of the variable as a whole, or the full 32 bits in the example above. Bitwise constraints add the ability to constrain arbitrary sub-fields of a variable and perform bitwise operations on the variable. Bitwise constraints can be defined as arithmetic relations where at least one of the following bit operations is used:

[:] (slice)
| (bitwise or)
& (bitwise and)
^ (bitwise exclusive or)
~(bitwise negation)
<< (shift left)
>> (shift right)

One example of such a bitwise constraint is the expression:

keep x[2:0]==0b101

Currently available code languages for test generation would compute the operator "[:]" as a function, such that in the above example, an unconstrained x variable would first be generated. Next, "x[2:0]" would be computed as a function, after which the value for this computed function would be compared to "0b101". Such a process would frequently result in an incorrect calculation, and hence an incorrect constraint. A more useful solution would handle such a bitwise constraint correctly through more flexible generation. Unfortunately, such a solution is not currently available.

SUMMARY OF THE INVENTION

The background art does not teach or suggest a method for providing bitwise constraints for test generation code languages, such that these constraints are correctly and flexibly handled.

The method of the present invention overcomes these deficiencies of the background art by enabling bitwise or bit slice constraints to be provided as part of the test generation process, by providing a language structure which enables these constraints to be expressed in a test generation language such as e code for example. The language structure for such bitwise constraints is then handled in a more flexible manner, such that the test generation process does not attempt to rigidly "solve" the expression containing the constraint as a function. Therefore, the propagation of constraints in such a structure do not necessarily need to be propagated from left to right, but instead are generated in a multi-directional manner. The language structure is particularly suitable for such operators as "[:]", "|", "&", "^", "~", ">>" and "<<".

According to the present invention, there is provided a method for providing a bitwise constraint for test generation, the method comprising: providing a language structure for expressing the bitwise constraint, said language structure including a plurality of constraint parameters and at least one operator, said constraint parameter constrained to an interval containing at least one value, said interval having interval limits; propagating information bi-directionally to determine interval limits for said constraint parameters; and generating a test value for the constraint parameter.

The method of the present invention could also be described as a plurality of instructions being performed by a data processor, such that the method of the present invention could be implemented as hardware, software, firmware or a combination thereof. For the present invention, a software application could be written in substantially any suitable programming language, which could easily be selected by one of ordinary skill in the art. The programming language chosen should be compatible with the computing platform according to which the software application is executed. Examples of suitable programming languages include, but are not limited to, C, C++ and Java.

BRIEF DESCRIPTION OF THE DRAWING

The invention is herein described, by way of example only, with reference to the accompanying drawing, wherein.

DESCRIPTION OF THE PREFERRED EMBODIMENTS

Figure 1:
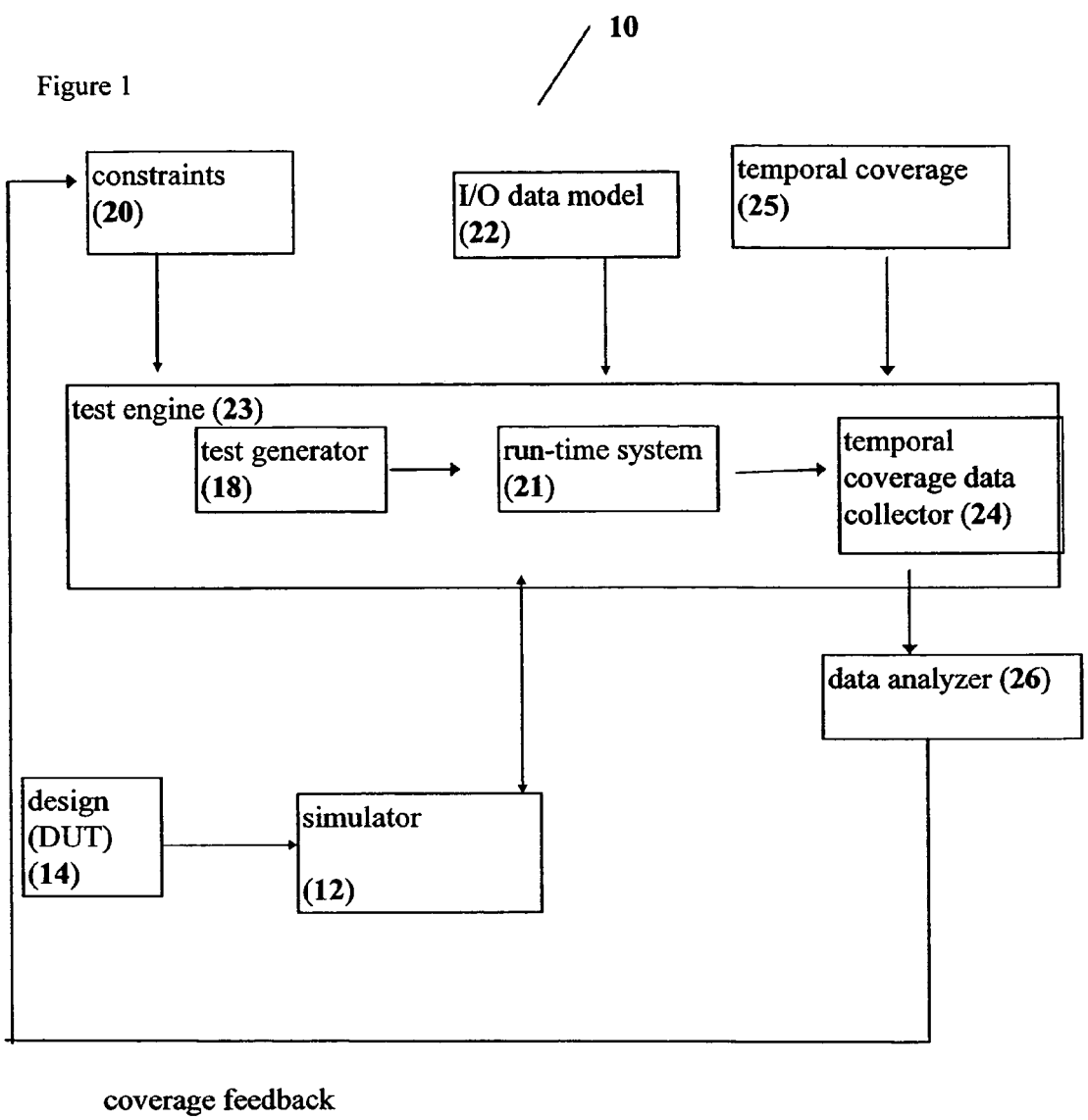
FIG. 1 is a schematic block diagram illustrating an exemplary system according to the present invention.

The method of the present invention enables bitwise or bit slice constraints to be provided as part of the test generation process, by providing a language structure which enables these constraints to be expressed in a test generation language such as e code for example. The language structure for such bitwise constraints is then handled in a more flexible manner, such that the test generation process does not attempt to rigidly "solve" the expression containing the constraint as a function. Therefore, the propagation of constraints in such a structure does not necessarily need to proceed from left to right, but instead are preferably generated in a multi-directional manner. The language structure is particularly suitable for such operators as "[:]", "|", "&", "^", "~", ">>" and "<<".

It should be noted that this language structure is the syntactic form that expresses bit constraints, e.g. "keep x[5:8]==0", and should be distinguished from the computational structure, which supports simple computations with arithmetic and bit constraints and which is a range-list with bit representation according to the present invention. Preferably, the computational structure enables arithmetic and bit constraints to be solved simultaneously, or at least in parallel.

According to the method of the present invention, preferably the computational structure for the bitwise constraints is constructed on the basis of range lists. Each range list includes at least one interval, but may optionally include a plurality of intervals, in which case the range list representing an unconstrained parameter includes one interval containing all possible values. One or more intervals may become invalid during the process of range list intersection. The range lists are then extended with a vector of state values, each of which corresponds to one bit of the generated item. The range list representation is of an arithmetical range, which represents possible values. Each arithmetical value in that range is then preferably mapped to a bit, according to the bit constraint, by translating the number into a value from the vector of state values.

Preferably, each element in the vector has four state values. State values more preferably represent four possible states of the corresponding bit:
0—the bit is definitely zero;
1—the bit is definitely one;
T—the bit can be either zero or one; and
⊥—the bit cannot take any legal value, such that a contradiction exists. For example, if the bit constraint forces the bit to be zero or one, then the corresponding representation is made with the bit set to zero or one. If there is no constraint on the value of the bit, it is set to the "T " operator; if no other option is possible, then the bit is set to "⊥", in which no legal value is possible. The computational structure itself preferably includes both interval representation and bitwise representation.

This computational structure can then be used in order to preferably simultaneously represent two different types of constraints. The first type of constraint includes any constraint having an operator as previously defined, which is a bit constraint. The second type of constraint includes a constraint which is related to a constraint of the first type through the propagation of "bitwise" information. The second type of constraint is preferably computed by translating the range list into bitwise values, which take one of the above states of the vector, according to the bit constraint as previously described. Preferably, these different types of constraints are propagated in a bidirectional manner within the bitwise constraint structure; in other words, the effect of resolving arithmetical constraints on bitwise constraints is optionally and preferably assessed, as well as the opposing effect.

The combination of both types of constraints is preferably used for assisting in the resolution of structures related to both types of constraints simultaneously. The combination of these two different structures provides for a more efficient process of resolution, since test generation may optionally feature both bit constraints and arithmetic constraints.

For example, the conversion of bit constraints to range list representation, which would be required if both types of structures could not be resolved simultaneously, could possibly result in an unbounded number of ranges. Similarly, bit constraints alone are not operative to define both types of structures, if range list computational structures were not available, since arithmetical constraints cannot be represented efficiently by bitwise values.

According to preferred embodiments of the present invention, the bitwise constraints are generated by being first reduced, more preferably through the manipulation of the two different types of constraints simultaneously, or at least in parallel. The step of reduction preferably is performed by computing a new value for one of the parameters of the constraint, and then intersecting the range of values of the parameter by this new value, using a bitwise &. For example, given two range lists with corresponding bitwise information, the union of the range lists and the bit information can optionally and preferably be performed, while still maintaining the meaning/effect of the bit constraints and the arithmetical constraints.

More preferably those bit(s) in the interval which should be zero are indicated by the maximum of the interval.

During the process of value generation with the bitwise constraint structure, preferably the number of solutions for each interval of the interval representation is determined. An interval is then selected randomly according to its weight. Finally, a point is selected from within the selected interval.

According to optional but preferred embodiments of the present invention, an invalid interval may arise when a range list has one or more values that are illegal. Such an interval may optionally and preferably be examined for the effect of other constraints, as well as enabling the constraints on the invalid interval to be handled through the resolution of bitwise constraints in the preferably parallel bitwise structure. In resolving these constraints, the illegal values of the invalid interval may also be resolved by being removed, thereby eliminating the problem of invalid intervals. Such a process may optionally be termed "correction of the interval limit", as the limits of the interval may be changed through this process to remove illegal values, for example. Invalid intervals may also optionally be removed.

The principles and operation of the system and method according to the present invention may be better understood with reference to the drawings and the accompanying description.

Referring now to the drawings, FIG. 1 is a schematic block diagram illustrating an exemplary system according to the present invention for test generation. It should be noted that the illustrated system only includes those functions of the test generation procedure which are required for the description of the present invention. A more complete description of the entire test generation procedure may be found in U.S. patent application Ser. No. 09/020,792, previously incorporated by reference. It should also be noted that although the present invention is described in the context of a simulation model, the present invention is also useful for verification of a physical device. Both the physical device and the simulation model can be described as a DUT (device under test), which is in a test environment.

A test generation system 10 features a simulator 12, which may accept a design 14 for the device under test (DUT), written in a hardware descriptive language such as Verilog or VHDL. In addition, simulator 12 interacts with a test engine 16 for performing the test generation procedure at run-time.

The interaction between simulator 12 and test engine 16 is shown as bidirectional, since test engine 16 provides input to simulator 12, and in turn receives the results from simulator 12 as input for further operation.

Test engine 16 features a test generator 18, connected to a run-time system 21 for testing DUT 14 at run-time. Test generator 18 receives one or more constraints 20, such as the bitwise constraints described in greater detail below, and an I/O data model 22, and then performs the testing and verification of DUT 14. Run-time system 21 both drives and samples simulator 12 during the run-time testing procedure. Run-time system 21 also evaluates temporal expressions and emits events. These events are defined according to a temporal coverage event definition input 25, which feeds the definitions of the events to be covered to run-time system 21.

During the process of testing and verification, a temporal coverage data collector 24 requests the values for one or more variables from run-time system 21. These requests are performed according to a triggering event emitted by run-time system 21, such as a fixed, predefined sampling time and/or the occurrence of a temporal pattern of state transitions as defined by a temporal expression given in a temporal language, for example. Temporal coverage data collector 24 is able to communicate with test generator 18 and to access the requested data through the API (application programming interface) for test generator 18. Such an API specifies the software function calls required in order to collect the desired data. This collected data is then analyzed by a data analyzer 26, as described in greater detail below.

After being analyzed by data analyzer 26, the analyzed data is then displayed to the user, preferably through a GUI (graphical user interface; not shown). For example, the data could be displayed to indicate the presence of particular coverage holes for single coverage items, cross-coverage items and/or interval coverage items. According to a preferred embodiment of the present invention, the analyzed data is used as feedback to adjust constraints 20 according to the coverage afforded by these constraints. For example, if a coverage hole or holes were found, constraints 20 could be adjusted in order to test the absent state or states of DUT 14. Such feedback is preferably performed automatically, but could also optionally be performed manually by the user.

According to a preferred embodiment of the present invention, constraints 20, I/O data model 22 and temporal coverage 25 are preferably constructed in e code, which is the code language provided by the Specman™ functional programming environment (Verisity Design, Inc., Mountain View, Calif., USA) and disclosed in U.S. patent application Ser. No. 09/020,792. Such an embodiment is preferred because of the ease and flexibility of programming in e code. The following description centers upon this preferred embodiment, it being understood that this is for the purposes of description only and is not meant to be limiting in any way.

The e code language is a hardware-oriented verification specific object-oriented programming language. Objects in this language are instances of "structs", which contain a field, and one or more functions, or methods, which operate on data stored within the field and which interact with other objects. Optionally, a constraint can operate on the field, thereby altering the data stored in the field, for example by restricting the range of possible values for the data. The field can also be used to store more complex structures, including other structs and lists of scalars or structs.

The process of test generation fills data elements, including structs and fields, with random values. The possible data values for each element can optionally be limited by constraints, which provide the direction for the directed test generation. The method of the present invention is particularly directed toward the provision of bitwise constraints. The following section describes a number of illustrative command structures for such constraints in the e code language, it being understood that these command structures are only being given for the purposes of illustrating a particularly preferred embodiment of the present invention. In addition, a description is provided of exemplary algorithms for solving such bitwise constraints. This example is illustrative only and is not intended to be limiting in any way. For a more complete explanation of the commands, see U.S. patent application Ser. No. 09/020,792, previously incorporated by reference.

Examples are provided of the ability of the present invention to handle the following constraints:

keep x[j:i]=y    (1)

keep x|y==z    (2)

keep x & y==z    (3)

keep X^y==z (4)

keep ~x==y    (5)

keep x<<k==y    (6)

keep x>>k==y    (7)

Currently each of the operators "[:]", "|", "&","^", "~", "<<" and ">>" can be only computed as functions. Thus, in all the constraints listed above the information can be propagated only from left to right. As a result some very intuitive user constraints, such as keep x[2:0]==0b101;

may not be solved by the test generator as known in the background art. The currently known algorithm for such a generator would generate an unconstrained x first, then compute x [2:0] as a function and then check if this value equals 0b101. Naturally, this strategy would be unsuccessful in 7/8 of all cases.

The present invention provides a new strategy for more flexible handling of the above constraints. The present invention preferably operates by rendering all of the constraints from (1) to (7) as multi-directional constraints, thereby preferably providing several modes of constraint propagation between constraint parameters.

Initial Assumptions

For the problem (1) it is agreed that i and j are generated before x and y, i.e. there is no constraint propagation from x and y to i and j. Similarly, for the problems (6) and (7) there is no propagation from x and y to k. In practice these restrictions mean that constraints like:

keep 125[j:i]==0b101;

keep 14>>k==7;

cannot be solved for i, j or k.

Basic Data Structure: bitRL

The data structures for bitwise constraints handling are preferably constructed on the basis of RL's (new range lists). A new structure called bitRL is preferably obtained by extending RL type with a vector of 4-state values, each of which corresponds to one bit of the generated item. Values in this vector represent four possible states of the corresponding bit:

0—the bit is definite zero,
1—the bit is definite one,
T —the bit can be either zero or one,
⊥—the bit cannot take any legal value (indicates a contradiction).

The following notation for bitRL is used through this document:

$$X == \left\{ \begin{array}{c} [x1 \ldots x3, x3 \ldots x4, \ldots ] \\ \{0T110T00\ldots\} \end{array} \right\}$$

The two components of this representation are called respectively interval representation and bitwise representation.

The following two groups of constraint parameters should be represented by bitRLs:
1. parameters of constraints (1)-(7),
2. parameters connected with those from the first group by constraints for which "bitwise" information can be propagated across the constraint.

Algorithms

Reduction

Problems (2), (3) and (5) may optionally and preferably be reduced straightforwardly using Table 1. A basic reduction step consists in computing a new value for one of the constraint parameters and then intersecting the range of this parameter (using bitwise &) by this new value. Full reduction of a bitwise constraint thus consists in successive application of this basic step to each constraint parameter.

TABLE 1

Reduction of bitwise operations

Reduction of bitwise operations

| \| | ⊥ | 0 | 1 | T | & | ⊥ | 0 | 1 | T | — | | |
|---|---|---|---|---|---|---|---|---|---|---|---|---|
| ⊥ | ⊥ | ⊥ | ⊥ | ⊥ | ⊥ | ⊥ | ⊥ | ⊥ | ⊥ | ⊥ | | ⊥ |
| 0 | ⊥ | 0 | 1 | T | 0 | ⊥ | 0 | 0 | 0 | 0 | | 1 |
| 1 | ⊥ | 1 | 1 | 1 | 1 | ⊥ | 0 | 1 | T | 1 | | 0 |
| T | ⊥ | T | 1 | T | T | ⊥ | 0 | T | T | T | | T |

EXAMPLE 1

Consider the constraint keep x|y==z. Consider only the information about bits. Assume that all x, y and z are four-bit ranges with the following initial values:

x={0TT1} y={0T00} z=={T11T}

The reduction is then preferably performed as follows:
Compute a value of (x|y) applying the table for bitwise or separately for each pair of corresponding bits. The result is z'={0TT1}
Compute (z & z') which gives {0111} and assign this value to z. The result is:

x={0TT1} y={0T00} z={0111}

Using the same table for bitwise or compute the new value x'=(0T1T) of x. Intersecting x by x' produces:

x={0T11} y={0T00} z={0111}

Finally the similar steps for y are performed which in this example leaves it unchanged. Thus, the above result is final for this reduction.

Problems (6) and (7) are addressed straightforwardly by shifting the corresponding bitwise representations.

Constraint Propagation Within RLs

The information is preferably propagated in two directions inside bitRLs in order to solve both types of constraints in parallel. The maximum of the interval range indicates which bits in the bitwise representation should always be zero.

EXAMPLE 2

Assume, x is a 6-bit uint with the following initial range:

$$\left\{ \begin{array}{c} x = [2 \ldots 6, 10, 21 \ldots 30] \\ \{TTT1T0\} \end{array} \right\}$$

The maximum of the interval representation is 30, which is 011110. Thus, the most significant bit in the bitwise representation should be zero, i.e.

$$x = \left\{ \begin{array}{c} [2 \ldots 6, 10, 21 \ldots 30] \\ \{0TT1T0\} \end{array} \right\}$$

Propagation in the opposite direction is preferably used for correction of interval bounds and removing of invalid intervals.

EXAMPLE 3

If the range used in Example 2 is used, the following facts are observed:

21 is an imprecise bound since the range of x contains only even numbers (least significant bit is zero), 10 is not included in the range of x because its bitwise representation (001010) does not match the bitwise representation, 2 is an imprecise bound since the minimal number matching the bitwise representation is 4 (binary 000100).

For this case the correct result of the propagation from bitwise representation to intervals should be:

$$x = \left\{ \begin{array}{c} [4 \ldots 6, 22 \ldots 30] \\ \{0TT1T0\} \end{array} \right\}$$

The following example shows the above computations in more detail.

EXAMPLE 4

Assume the precise lower bound for the interval [21 ... 30] of Example 3 is to be computed. Namely, a minimal number t, such that 21≦ and t satisfies the bitwise representation {0TT1T0}.

The computation goes as follows. First, check if the lower bound satisfies the bitwise representation. In this case we are done. However, 21={010101}$_2$ does not match {0TT1T0}. Now, consider only those bits of 21 which correspond to T in the bitwise representation. Namely, the underlined bits from (0<u>10</u>1<u>0</u>1)$_2$ are used to obtain the number 4=(100)$_2$. The next step is to increment this number getting 5=(101)$_2$ and assign the obtained bits respectively to T-bits in the bitwise representation: the result is (010110)$_2$=22.

Similarly, upper bounds are computed by considering all bits corresponding to T in representation of the upper bound. The only difference is that decrement operation is used instead of increment.

As can be observed, the complexity of evaluation of each bound depends linearly on the number of bits in bitwise representation of range.

In general the process of propagation between bitwise and interval representation consists in computing precise bounds for each interval. Consider an interval [l ... h]. For the lower bound l a minimal number l' is computed such that l≦l' and l' matches the bitwise representation. Similarly for the higher bound h, a maximal number h' is computed such that h' and h' matches the bitwise representation. If the new interval [l' ... h'] is valid, i.e. l'≦h', it replaces [l ... h]. Otherwise the interval [l ... h] is removed from the representation.

Generation

In this section the question of value generation out of bitRLs is addressed. The following procedure is preferably followed:

Determine the number of solutions for each interval of the interval representation, Select an interval randomly according to its weight, Select a point within the selected interval.

The following examples illustrate how to compute the number of solutions for each interval in the interval representation.

EXAMPLE 5

Continuing with the case of Example 3:

$$x = \left\{ \begin{array}{c} [4 \ldots 6, 22 \ldots 30] \\ \{0TT1T0\} \end{array} \right\}$$

Consider the interval [22 ... 30]. The binary representations of the interval bounds are respectively 0<u>101</u>1<u>0</u> and 0<u>111</u>1<u>0</u>. Only the underlined bits are considered and collected, i.e. those which set to T in the bitwise representation of x. Now, if the underlined bits are collected, two numbers are obtained: 5=(101)$_2$ and 7=(111)$_2$. It's clear that each number satisfying the bitwise representation of x and laying inside [22 ... 30] can be obtained as a bit combination ranging between 101 and 111. There are 3 solutions (7−5+1) within the interval [22 ... 30].

Using the same technique, the first interval [4 ... 6] is used to compute two valid solutions.

Similarly, as binary representations can be used for computing the number of solutions, they can be used for random selection of points.

EXAMPLE 6

As it is shown in Example 5, the probability of selecting the interval [2 ... 6] on the second step of the generation algorithm is 2/5 and the probability of selecting [22 ... 30] is 3/5

(according to the number solutions in the intervals). Assume that the second step of the algorithm selects [22 ... 30]. Now, the goal is to find a number in [22 ... 30] which satisfies the bitwise representation of x. Each solution for this problem can be expressed as a binary combination of three bits ranging from 5=(101)$_2$ to 7=(111)$_2$. Thus, a number from the interval [5 ... 7] is selected randomly. Assume that the selection is 6=(110)$_2$. The final step consists in taking the three bits of 6 and assigning them to the positions represented by T in the bitwise representation of x. Thus, the final result is (0<u>111</u> <u>00</u>)$_2$=28.

Additional Reordering

In order to increase the number of cases successfully handled by the present invention, the following preferred additional order rules for "bit slicing" and "shift" constraints may optionally and preferably be considered:

keep x[j:i]==y:(i,j)→(x,y), (y)⇒(x)

keep x<<k==y:(k)→(x,y)

keep x>>k==y:(k)→(x,y)

Here "→" and "⇒" denote "hard" and "soft" ordering respectively. All "hard" order relations shown above are covered by the initial assumptions. The motivation behind the "soft" ordering (y)⇒(x) in bit slicing constraint is preferably explained by example.

EXAMPLE 7

Assume that the following constraint is present:

keep x[3:0] in [1,2,4,8];

This constraint naturally means that only one of four least significant bits of x should be 1 and all the others be 0. This constraint is preferably automatically translated into the following two constraints:

keep x[3:0]==t;

keep t in[1,2,4,8];

where t is a temporary variable. To avoid problems with this example, preferably the implicit "soft" ordering (t) (x) is used to generate t to one of values from [1,2,4,8].

Then the generated value is propagated to the bits of x and the constraint finally succeeds.

SOME EXAMPLES

The following declarations are assumed through this section:
x: byte;
y: uint(bits: 2);
Now consider separately the following eight test cases:
1. Given the Constraint:

keep x [4:3]==0;

This case can be solved by the present invention as shown in the previous sections.
2. Given the Constraints:

keep x [4:3]==0;

keep x>7;

Same as in (1).
3. Given the Constraints:

keep soft x [4:3]=0;

keep x>7;

Same as in (1). The reduce of "soft" constraint affects the bitRL of x exactly as in the case of "hard" constraints.
4. Given the Constraints:

keep x[4:3]==0;

keep soft x>7;

Same as in (3).
5. Given the Constraints:

keep x[5:4]==0;

keep x[7:6]>0 or x[3:0]>7;

keep x>7;

In this case the generator first reduces the first and the third constraints, which gives the following range for x:

$$x = \left\{ \begin{array}{l} [0 \times 8 \ ... \ 0xFF] \\ \{TT00TTTT\} \end{array} \right\}$$

Any value generated from this range by the present invention is either in [0x8 ... 0xF] or greater than 0xF, in which case it has some of the bits of x[7:6] set to 1. Thus, one of the or alternatives of the second constraint succeeds.
6. Given the Constraints:

keep x[4:3]==y;

keep gen (y) before (x);

keep soft y>0;

This test case is solved by the generator as shown in the previous sections. Moreover, the ordering (y)→(x) is redundant here because of the implicit ordering (y)⇒(x) imposed by the first constraint.
7. Given the Constraints:

keep x[4:3]==y;

keep gen (x) before (y);

keep softy >0;

This test case may fail in ¼ of cases because of user error. The problem here is that the information about the range of y ([1 ... 3]) cannot be captured in the bitRL of x. Thus, x[4:3] can be set to 0 if x is generated before y.
8. Given the Constraints:

keep x[4:y]==0;

By the initial assumption, y is always generated before x. So, y is generated to a value from [0 ... 3] and then the resulting constraint can be successfully solved by the generator.

An example of the actual process for providing and imposing bitwise constraints in the test generation environment is described in greater detail below, it being understood that this example is for the purposes of illustration only and is without any intention of being limiting. The exemplary constrained system is as follows.

First, a struct S, shown below, is assumed to have two fields, X and Y, of 4 bits each. The struct S also is assumed to have three constraints marked (1), (2) and (3) that impose a relationship between X and Y. The constraint (1) is arithmetic, while constraints (2) and (3) are bit-wise constraints.

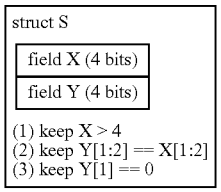

The application of constraint (1) to field X results in the following range list, shown in the box below.

X = 5...15

The application of constraint (3) to field Y results in the following bit range (T represents either 1 or 0), shown in the box below.

Y = <TT1T>...<TT1T>

Constraint (2) determines a relationship between field X and field Y. The application of constraint (2) first causes a conversion of the field X range list to bit ranges. The arithmetical values in the range list are preferably converted to bit ranges by first determining bit values for each arithmetical value. If the bit does not change throughout the values of the range list, then the bit is set to either 0 or 1. If the bit does change value throughout the arithmetical values, then the bit is preferably set to the "T" value. The effect of a bitwise constraint may cause the bit to be converted to "0", for example.

X = 5...15 → X = <T1T1>...<ITTT>

Next, the following reduce step results in anding together the bit ranges of fields Y and X to create a new bit range for field X, as shown in the boxes below.

Y = <TT1T>...<TT1T> → X = <T1T1>...<ITTT>

The generation step that follows assigns values in the permissible range, as determined from the previous step, such as setting field Y to 6 and field X to 7, for example, shown in the boxes below.

Y = 6

X = 7

While the invention has been described with respect to a limited number of embodiments, it will be appreciated that many variations, modifications and other applications of the invention may be made.

What is claimed is:

1. A method stored on a computer readable medium for providing a bitwise constraint for computer based test generation for design verification via device simulation, the method comprising:
encoding a processing device according to a language structure for expressing the bitwise constraint, said language structure including at least one constraint parameter and at least one operator, said constraint parameter being further constrained to an interval containing at least one value, said interval having interval limits;
actuating the processing device to propagate information bi-directionally to determine interval limits for said constraint parameters at least partially according to the bitwise constraint; and
actuating the processing device to compute one or more permissible values for the constraint parameter, thereby to resolve arithmetic and bitwise constraints together.

2. The method of claim 1, further comprising: generating a single test value for the constraint parameter.

3. The method of claim 2, wherein said interval is representable as an arithmetic range and as a bitwise representation.

4. The method of claim 3, wherein providing said language structure further comprises providing a computational structure for representing said interval as said arithmetic range and as said bitwise representation in parallel, for propagating information to determine said interval limits.

5. The method of claim 4, wherein said language structure comprises a plurality of constraint parameters and wherein said computational structure is provided for reducing at least a portion of said plurality of constraint parameters wherein the reducing comprises computing a new set of values for a first constraint parameter and propagating the new set of values to at least one other constraint parameter.

6. The method of claim 3, wherein the bitwise constraint is derived from a constraint featuring an operator through propagation of bitwise information.

7. A method incorporated in a computer system for providing a bitwise constraint for computer based test generation for design verification via device simulation, the method comprising:
providing in the computer system a language structure for expressing the bitwise constraint, said language structure including one or more constraint parameters and at least one operator, said constraint parameter having a range list containing at least one value;
operating the computer system to propagate information bi-directionally to determine limits for said constraint parameters; and
generating a test value for the bitwise constraint.

8. A method for providing a bitwise constraint and a range list constraint, for computer-based test generation for design verification via device simulation, with an arithmetic range list, the arithmetic range list containing at least one arithmetic value, the method comprising:
providing a means for establishing a language structure, said language structure expressing the bitwise constraint with regard to the arithmetic range list in parallel to the range list constraint, said language structure including one or more constraint parameters for the bitwise constraint and for the range list constraint and at least one operator;

providing a means for propagating information bi-directionally to determine limits for said constraint parameters; and providing a means for generating a test value for the bitwise constraint, thereby to resolve both an arithmetic constraint and said bitwise constraint together.

9. A method for bitwise representation of a range list having an arithmetic constraint and a bitwise constraint for compute-based test generation for design verification via device simulation, the method comprising:

providing a test engine including a test generator;

executing said teat generator to translate the range list to a bitwise list; and executing said test generator to generate a test, the test generator solving the arithmetic constraint together with the bitwise constraint while using one or both of the range list and said bitwise list thereby to resolve both the arithmetic constraint and said bitwise constraint together.

10. A method of computer-based test generation for design verification via device simulation for a range list having an arithmetic constraint and a bitwise constraint, comprising:

providing a system having distinct modules, and wherein the distinct modules include a range list translation module, and a bitwise constraint application module;

providing a computational structure for containing the range list and a bitwise representation of the range list;

translating the range list to provide said bitwise representation of the range list, wherein the translating the range list is performed by the range list translation module; and applying the bitwise constraint to said bitwise representation and the arithmetic constraint to the range list to perform the test generation, thereby to resolve both said arithmetic constraint and said bitwise constraint together, wherein the applying the bitwise constraint is performed by the bitwise constraint application module.

11. The method of claim 10, further comprising: performing a union of a plurality of range lists and of a plurality of said bitwise representations of a plurality of range lists to resolve the bitwise and arithmetic constraints.

12. A computer program product for use with a computer, the computer program product comprising a computer usable storage medium having a computer readable program code embodied therein adapted to be executed to implement a method in computer based test generation, for design verification via device simulation, for bitwise representation of a range list having an arithmetic constraint and a bitwise constraint, comprising:

translating the range list to provide the bitwise representation of the range list;

propagating the arithmetic constraint and the bitwise constraint to determine at least one new range according to both the arithmetic constraint and the bitwise constraint; and computing one or more permissible values for a constraint parameter, thereby to resolve said arithmetic and bitwise constraints together.

13. The method of claim 12 further comprising generating a value according to said at least one new range.

* * * * *

UNITED STATES PATENT AND TRADEMARK OFFICE
CERTIFICATE OF CORRECTION

PATENT NO.        : 7,613,973 B2                                    Page 1 of 1
APPLICATION NO. : 11/015020
DATED             : November 3, 2009
INVENTOR(S)       : Lagoon et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1033 days.

Signed and Sealed this

Nineteenth Day of October, 2010

David J. Kappos
*Director of the United States Patent and Trademark Office*